United States Patent [19]
Jain et al.

[11] Patent Number: 5,155,679
[45] Date of Patent: Oct. 13, 1992

[54] SET-UP OPTIMIZATION FOR FLEXIBLE MANUFACTURING SYSTEMS

[75] Inventors: Shailendra E. Jain; Paul F. Williams, both of Sunnyvale, Calif.

[73] Assignee: Hewlett-Packard Company, Palo Alto, Calif.

[21] Appl. No.: 452,528

[22] Filed: Dec. 18, 1989

[51] Int. Cl.$^5$ .................. G05F 15/20; G05F 15/46
[52] U.S. Cl. .................. 364/402; 364/468; 364/478
[58] Field of Search ............ 364/402, 403, 468, 478, 364/140, 900, 200

[56] References Cited

U.S. PATENT DOCUMENTS

| | | | |
|---|---|---|---|
| 4,835,687 | 5/1989 | Martin | 364/402 |
| 4,852,001 | 7/1989 | Tsushima et al. | 364/900 |
| 4,866,628 | 9/1989 | Natarajan | 364/403 |
| 4,887,218 | 12/1989 | Natarajan | 364/403 |
| 4,896,269 | 1/1990 | Tong | 364/401 |
| 4,956,784 | 9/1990 | Hadavi et al. | 364/403 |

OTHER PUBLICATIONS

"Solution of a large-scale traveling salesman problem" by G. Dantzig, R. Fulkerson, and S. Johnson; The Rand Corporation, Santa Monica, Calif. (Journal of the Operations Research Society of America, vol. 2, 1954).

B. Golden et al. "Approximate Traveling Salesman Algorithms" Operations Research, vol. 28, No. 3, Part II, May–Jun. 1980, pp. 694–711.

Jonathan F. Bard et al. "A Heuristic for Minimizing the Number of Tool Switches on a Flexible Machine" IIE Transactions, vol. 20, No. 4, Dec. 1988, pp. 382–391.

S. Lin and B. W. Kernighan, "An Effective Heuristic Algorithm for the Traveling Salesman Problem", Bell Telephone Laboratories, Oct. 15, 1971.

Ichiro Inoue and Masao Managaki, "PROPS: an Interactive Simulator for Job Shop Production System Evaluation" N.E.C. Research & Development, No. 71, Oct. 1983, pp. 89–96.

(List continued on next page.)

Primary Examiner—Roy N. Envall, Jr.
Assistant Examiner—Xuong M. Chung

[57] ABSTRACT

An iterative method of sequencing jobs in a flexible manufacturing environment where such manufacturing jobs have sequence-dependent set-up times provides for solutions which approximate optimal sequencing while requiring only modest computational resources. Initially, the invention recasts a sequence of manufacturing jobs as a dynamic traveling salesman problem (TSP), in which the system must reconfigure itself and then execute each job in the same way a salesman must visit a sequence of cities, but where the distances between cities change depending upon cities already visited. The first step of the invention reduces the difficult dynamic traveling salesman problem to a static TSP, where distances between each possible job pair are fixed as a monotonic function of parts the two jobs share in common. The second step solves the resulting static traveling salesman problem, by maximizing total distance found by exploiting part commonality between jobs, to obtain a good initial solution to the job sequencing problem. The invention further improves upon the initial solution by selectively perturbing the initial sequence and calculating any changes in the number of part swaps required to reconfigure the manufacturing system. The perturbation and calculations iterate until no improvement is found. The ending sequence should be close to optimal for the job sequence and system. As a final step, a modified "keep part needed soonest" algorithm, accounting for later sequence and overall historical use of parts, optimizes the number of configuration changes for the final sequence. To assure near-optimality for the final sequence, a lower bound calculation provides a limit on how few part changes are possible for the current collection of jobs. The inventive method readily handles job sequencing problems which are difficult or impossible to solve with conventional techniques.

10 Claims, 3 Drawing Sheets

OTHER PUBLICATIONS

Christopher S. Tang, "A Job Scheduling Model for a Flexible Manufacturing Machine" Proceedings of 1986 IEEE Conference on Robotics and Automation, pp. 152–155.

C. F. Lofgren and L. F. McGinnis, "Dynamic Scheduling for Flexible Printed Circuit Card Assembly" pp. 1294–1297.

Shahrukh Adi Irani et al. "Single Machine Setup-dependent Sequencing Using a Setup Complexity Ranking Scheme" Journal of Manufacturing Systems, vol. 7(1988) No. 1, pp. 11–23.

Christopher S. Tang et al. "Models Arising from a Flexible Manufacturing Machine, Part 1: Minimization of the Number of Tool Switches" Operations Reserach, vol. 36, No. 5, Sep.–Oct. 1988, pp. 767–777.

SET-UP OPTIMIZATION FOR FLEXIBLE MANUFACTURING SYSTEMS

BACKGROUND OF THE INVENTION

The present invention relates to manufacturing and, more particularly, to the ordering of manufacturing jobs having sequence-dependent set-up times.

The advent of automated stations for manufacturing products, i.e. flexible manufacturing systems (FMS), has provided for the rapid and accurate assembly of a wide selection of products. In fact, the assembly process can be so rapid that the time required in setting up a particular FMS machine for its next product run can account for most of the total production time. As an example, an automated tooling machine, capable of milling, shaping and drilling materials such as metal into final pieces, requires the proper tools to be in place before its next run. Both transfer and fine-adjustment of the particular tool "palette" required by the FMS machine consume time otherwise available for production, thus increasing costs and time to delivery. Due to the relatively large capital investment in FMS machines, loss of production time becomes a particularly acute problem.

The problem of minimizing set-up times in an FMS environment can be illustrated in the context of automated printed circuit board (PCB) loading machines. These machines automatically place electrical components onto printed circuit boards by following computer instructions. A typical machine holds 100 different components out of a total inventory of 500 or more. While each PCB to be manufactured may typically require only 10 to 70 of these components, the mix of components required for different PCB types can be partially or completely different. Setting up the automated PCB loading machine with a new set of components for the next PCB run consumes precious production time. In a production environment comprising a high mixture of different PCB (or other product) types, each type produced in low volume, the set-up times between jobs can account for 60-70% of total production time.

The fundamental FMS scheduling problem reduces to that of ordering jobs in an optimal sequence such that swapping of required resources is minimized. For an automated tooling machine, this reduces the number of tool changes required for a sequence of jobs. For a PCB loading machine, one seeks to minimize the number of component swaps required. In any automated flexible manufacturing environment, the problem may be formulated exactly the same way: the manufacturing planner seeks to minimize the time used in sequentially reconfiguring a manufacturing system for a series of different jobs.

Except for the simplest of systems, the typical FMS scheduling problem defies closed-form solution. The number of variables and resultant equations involved makes an optimal solution extremely time-consuming if possible at all. Calculating all possible job sequences and ranking them by the number of tool or component switches required likewise remains highly inefficient. In both cases, the computations may not conclude before the production day has passed. To provide a useful solution in a practical period of time, planners require some form of heuristic or approximation algorithm.

One proposed heuristic for solving the FMS scheduling problem attempts to solve the linear programming problem using Lagrange relaxation techniques. Bard, J., "A Heuristic for Minimizing the Number of Tool Switches on a Flexible Machine", *IIE Transactions*, December 1988, pp. 382-391. In essence, the Lagrangian technique relaxes certain requirements of the formal sequencing problem in order to solve a simpler but inexact set of equations. The technique yields a collection of potentially feasible solutions. The heuristic then makes small changes or perturbations to each of the possible solutions to find a solution which has both a low number of reconfigurations and for which any small alteration of sequence causes the number of tool switches only to increase. The "solution" found through this heuristic represents a *local* minimum, in the sense that small excursions from the resulting sequence only increase the set-up time. The heuristic, however, provides little guarantee that the resultant sequence is in fact a *globally optimal* solution for the problem. In addition, despite implementing a simpler set of equations, the results shown in the Bard paper apply only to very simple FMS environments. FMS machines often involve a far greater number of component or tool locations and a greater number of tools/components in inventory, rendering even the reduced set of equations unmanageable for computation.

Another approach to the FMS sequencing problem compares it to the familiar traveling salesman problem (TSP). The classical TSP stipulates that a salesperson must visit a sequence of cities one at a time, never visiting a city twice. The constraint applied to the sequence is that it minimize the total distance travelled. The FMS sequencing problem may be compared to the classical TSP if each city represents a batch of identical PCBs to be manufactured and the travel distance between cities represents the number of tool switches required between PCB batches. The FMS problem is not in fact identical to the classical traveling salesman problem because the distances between the PCB "cities" depend upon those PCBs already manufactured. In other words, the FMS machine constantly changes its configuration state, varying the number of component switches required for the next job. Clearly, the dynamic FMS problem is far more difficult than the classical static traveling salesman problem. If the classical traveling salesman problem is then a "static" problem (TSP-S), with constant distances between cities, the FMS sequencing problem is a "dynamic" TSP, or TSP-D, where inter-city distances lengthen or decrease depending on where the salesperson (i.e. FMS machine) has already been.

One method of solving the flexible manufacturing sequencing problem, first cast as a dynamic traveling sequencing problem, solves a related static traveling salesman problem to arrive at a potential set of likely sequence candidates, as disclosed for example by Tang, C. and Denardo, E. in "Models Arising from a Flexible Manufacturing Machine, Part I: Minimization of the Number of Tool Switches", *Operations Research*, Vol. 36, No. 5, pp. 767-777, 1988. Tang and Denardo use the minimum number of component or tool switches between any given pair of jobs as the inter-city length for the static TSP. The problem is solved by minimizing the total distance (here, the total number of tool/component switches) for the entire sequence of jobs. After arriving at one or more potential sequence candidates, the method determines exactly how many tool switches are in fact used and ranks sequences by their numbers of switches: the sequence with the lowest number is selected.

Tang and Denardo's heuristic for solving the flexible manufacturing sequence problem involves several serious limitations. The most complex job environment described for test data comprised a tool-inventory of 30 tools, a machine capable of holding 15 of the tools and a set of 40 jobs. However, FMS machines, such as the PCB loading system described above, can hold around 100 components, selected from inventories often greater than 500 components. Confronted with complex FMS environments and large component inventories, Tang and Denardo's method does not converge adequately to a sequence solution. In addition, in implementing any sequencing algorithm one desires at least a rough measure of how far the solution remains from optimality. Tang and Denardo provide no theoretical lower bound on optimality with which to compare the results of their heuristic. Applied to complex manufacturing sequencing problems, one might never discover whether great improvement has been accomplished or not using Tang and Denardo's procedure.

What is needed is an improved method and system for choosing sequences of jobs on flexible manufacturing systems. The method and system should account for the complexities of actual manufacturing environments. More specifically, the method should allow for large numbers of tools and components, of which only a small portion are selected for any given job. In addition, the method should demonstrate a high likelihood of converging upon a globally optimal solution to the sequencing problem in a reasonable time using affordable computational resources. Furthermore, the method should provide some estimate of how inferior the solution remains from optimum.

SUMMARY OF THE INVENTION

In accordance with the present invention, an improved set-up optimization method and system for flexible manufacturing systems employs a similarity-based distance assignment for the static traveling salesman problem. Preferably a pair-wise perturbation of the resulting static TSP solution leads to further optimization in order to minimize the number of component switches required. In addition, a component-switching algorithm incorporates the probability of future component use in deciding which components to keep. This method provides, in a short time, an optimal or a near optimal solution to the dynamic traveling salesman problem, a formalization characteristic of any set of manufacturing jobs having sequence-dependent set-up times.

Since the present invention involves mathematical operations which can be cast in widely different but mathematically equivalent expressions, the scope of the present invention is defined in terms of equivalents of a particular expression. Those skilled in the art will recognize that equivalent formalizations can use different numbers of steps, different combinations of operations with steps, and different expressions for operations. Mathematical techniques can resolve unambiguously the question of mathematical equivalence of methods for the purpose of determining the scope of the present invention.

The set-up optimization method of the present invention shares certain conventions with previous heuristic attempts. A plurality of jobs require sequencing on a manufacturing resource, described throughout as a flexible manufacturing system. An FMS can comprise any device or environment, ranging from an automated tooling machine to a PCB loading device. In any such FMS environment, the set-up times required between jobs depends upon the exact job sequence chosen. If not, any job sequence is optimal from a set-up reduction point-of-view, requiring no special algorithm for solution.

The printed circuit board environment is used throughout for a preferred embodiment of the present inventive method. In this environment, the numbers of component switches indicate the total amount of set-up time required between a given pair of jobs. It should be clear that the same formalism can stand for numbers of tools to switch in and out, or in general, the numbers of parts used to populate a given configuration of a flexible manufacturing system machine. Each job is performed only once and every position in the job sequence is filled with a job. The objective of the method is to assign the jobs in a sequence such that optimizing the number of component switches before each job results in the lowest number of total switches for the complete job sequence.

A first step in the set-up optimization method involves reducing the complex dynamic traveling salesman problem into a related and more readily solvable static TSP. Instead of using the required numbers of component switches as a "distance" between jobs, as in Tang and Denardo's approach, the preferred method assigns distances or "pair values" based upon component congruence or similarity. In other words, if two PCBs have 15 components in connon, their static distance is assigned the number 15. Each possible pairing of PCBs receives a similarity pair value, providing a measure of how much the environment remains the same to produce each job pair.

A second step in the preferred method solves the static traveling salesman problem using the similarity-based pair values assigned in the first step. However, instead of attempting to minimize the overall component-switching distance, the present method maximizes the overall component-keeping distance. (The overall component-keeping distance will be termed the "sequence value"). This maximization remains consistent with the original distance assignment: pair values between job-cities indicate the number of components you keep between jobs. The more components kept for the job sequence overall, the fewer which need to be switched. A variety of techniques, well-known in the art, may be employed to solve for a "maximal sequence" of the static traveling salesman problem, yielding an initial feasible solution to the actual dynamic TSP. The initial solution to the FMS sequencing problem embodies the invention in its general form.

To further optimize the initial solution found in the second step, a third step of the preferred method calculates the optimal number of component switches for the initial solution. A "keep-part-needed-soonest" (KPNS) optimal algorithm minimizes the total number of components switched for any given job sequence and initial machine set-up. (Throughout the following specification, "part" is understood to embrace a component and/or a tool used in an FMS). The policy is simply described. At any instant between jobs, no component is inserted unless required for the next job. In addition, if a component must be inserted, the components that are kept (not removed) are those needed soonest by the remaining jobs in sequence. Applying the KPNS algorithm to the first solution sequence results in both an optimal sequence of configuration states used by the FMS machine to process the first solution sequence determined in the second step and provides a component-switching benchmark, or "swapping value", for this sequence as well.

A fourth step of the preferred method systematically perturbs the first solution sequence, calculating each new variant sequence's number of component switches. The perturbation involves switching a pair of jobs in the sequence, using the KPNS algorithm as a fifth step to recalculate the number of component switches for the new sequence. The perturbation procedure is repeated for all job pairs of the original sequence. If there is any improvement in the number of switches required, the sequence with the greatest improvement is retained and becomes the new solution sequence and the same perturbation procedure repeats using the new sequence. Once a sequence results which provides no improvement under perturbation, fourth and fifth steps conclude and the final sequence is retained as near-optimal.

A sixth step of the set-up optimization method applies a modified KPNS algorithm to the final sequence found in the fourth and fifth steps. The modified KPNS algorithm duplicates the normal KPNS policy with one further refinement: if a plurality of components exist in a given configuration set available for switching, among which none are needed in the remaining jobs, these components are removed in reverse order of their historical and/or future probability of use. Thus, tools are kept which historically are used more often. The current job sequence will leave the manufacturing environment in a state more likely to be of use to the job sequence of tomorrow. The modified KPNS algorithm does not improve the solution for the current job run, but will provide benefits in future optimization runs with new job sequences.

The present invention shares with Tang and Denardo's FMS approach the strategy of reducing a hard-to-solve dynamic traveling salesman problem (D-TSP) to a more readily solvable static traveling salesman problem (S-TSP). The present invention differs fundamentally from Tang and Denardo's approach in that the reduction is to a different S-TSP. In the present invention the goal is to maximize part commonality between successive jobs. Tang and Denardo strive to minimize the parts which must be switched between jobs.

The present invention prioritizes potential job sequences more effectively than does the approach of Tang and Denardo. Specifically, Tang and Denardo's approach of minimizing switching equates too many pairs of jobs for optimality to be assured. In the extreme case, where no job requires more than half the number of parts manageable by an FMS, all switching or pair values would be zero. For example, if an FMS can handle a hundred circuit components at a time and there are ten circuit board types requiring at most 50 circuit components each, the minimum number of components requiring switching between any two board types is zero. This is because the machine can hold at most fifty components required by one board type and the at most fifty required by a second board type at the same time. In such a case, Tang and Denardo's approach would fail to prioritize potential sequences at all. In less extreme cases, there would still be many failures to distinguish among favorable and unfavorable sequences. From the perspective of the traveling salesman problem, there are more pairs of cities with zero distances in the simplified static traveling salesman problem than are justified by the original dynamic traveling salesman problem.

By striving to maximize part commonality, the present invention more sensitively evaluates job pairs. In most cases the number of job pairs sharing a maximum part commonality will be much lower than the number of job pairs sharing a zero (or other minimum) switch count. Therefore, the present invention can more effectively eliminate non-optimal sequences from consideration so as to enhance the likelihood of an optimal or near-optimal solution.

Another advantage of the present invention over Tang and Denardo's approach is machine independence. The number of parts required to be switched between two jobs is dependent upon the capacity of the FMS, while the number of parts in common between two jobs is machine independent. Therefore, a solution derived by the present invention can be applied to machines of different capacity, while Tang and Denardo's approach calls for reapplications of their heuristic to accommodate machines of different capacities.

In addition, the present invention provides for superior improvement of an initial solution than that provided for by Tang and Denardo. The present invention also provides for a lower bound value to evaluate the optimality of a solution. Tang and Denardo do not provide a practical method of evaluating the optimality of their solutions.

The results of the set-up optimization method exactly specify in what order each job should be performed and after each job is completed, which components should be switched. The present invention uses a superior method of inter-job distance assignment, based upon commonality of component use, to achieve a near-optimal solution faster with less missteps. The final sequence will not always be strictly optimal. However, it will be a practically attainable solution closely approaching optimal. The combination of the similarity-based distance assignment for solving a static traveling salesman problem with a pair-wise perturbation algorithm for adjusting the initial solution yields a set-up optimization method providing faster and better solutions in realistic manufacturing environments. In addition, the refinement of a KPNS policy by including the historical use of each component expands the savings in time and production costs from the current job sequence to sequences in the future. These and other features and advantages of the present invention are apparent in the description below with reference to the following drawings.

DESCRIPTION OF THE PREFERRED EMBODIMENTS

Figure 1:
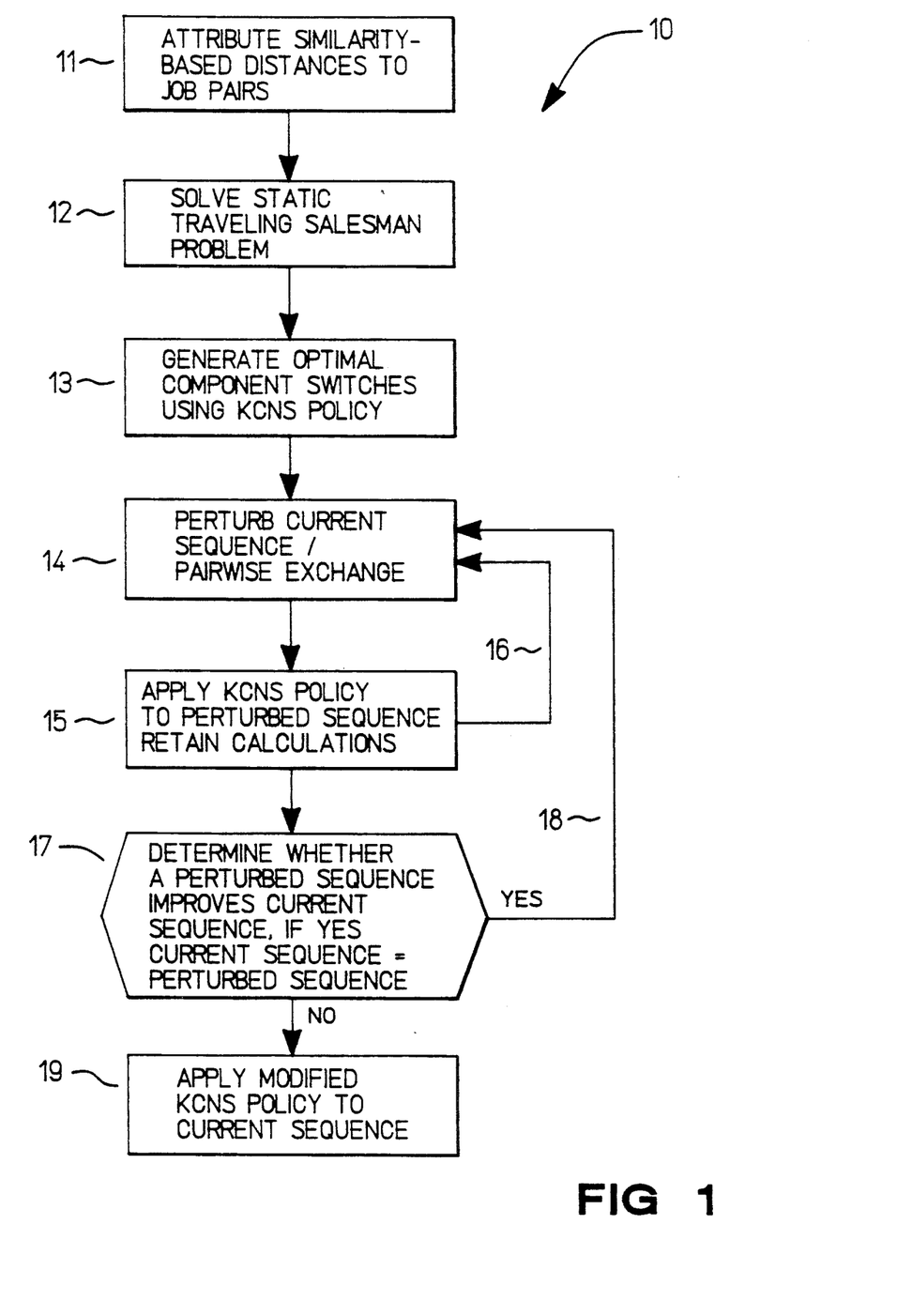
FIG. 1 is a flow chart in accordance with the method of the present invention.

In accordance with the present invention, a set-up optimization method for a flexible manufacturing system 10, illustrated in FIG. 1, can be described as a series of steps 11-19 including iterative loops 16 and 18. The first step 11 reduces the difficult dynamic traveling salesman problem for the job sequence to a static TSP by attributing a similarity-based distance or pair value to each job pair. In the example of a PCB loader, the pair value represents the number of components the two jobs share in common. While numbers of components will be used in describing a preferred embodiment, it is understood that components embrace any index of commonality between job configurations. In the case of an automatic tooling machine, components can refer to the numbers of tools required.

The second step 12 solves the static TSP using any of a variety of known techniques, producing a first solution sequence whose total distance, or sequence value, (i.e. commonality of job configurations) is maximized. A third step 13 calculates the optimal number of component switches at each change of jobs, using a keep component needed soonest algorithm. The resulting job sequence and its optimal number of component switches forms a seed job sequence for the iterative perturbation algorithm of steps 14 through 18.

The fourth step 14 interchanges a single pair of jobs in the current sequence. Fifth step 15 reapplies the KPNS policy to the perturbed sequence of step 14, calculating its optimal number of component switches. The sixth step 16 iterates the pair-wise perturbations of steps 14 and 15 for all possible pairs of the original sequence. Once all perturbations of the sequence have been exhausted, the seventh step 17 determines if any improvement in the number of required component changes has resulted and if so, which perturbed sequence offers the greatest improvement. In the event several sequences offer the same greatest improvement, one is selected arbitrarily. Step 17 makes that sequence the new baseline solution sequence. Step 18 iterates the entire perturbation procedure of steps 14 through 16 for the new sequence. Once again, step 18 iterates step 17 to determine if any improvement has occurred. If not, the iterative portion of the algorithm concludes and the current job sequence represents a near-optimal solution to the job sequence dynamic traveling salesman problem.

A final step 19 applies a modified KPNS policy to the resulting job sequence, making component swapping choices both on the basis of which components are needed soonest and, in the case where some components are not needed later in the sequence, on the basis of which components are historically used more often. Once the modified KPNS procedure terminates, the final job sequence and component switching schedule are reported.

Figure 2:
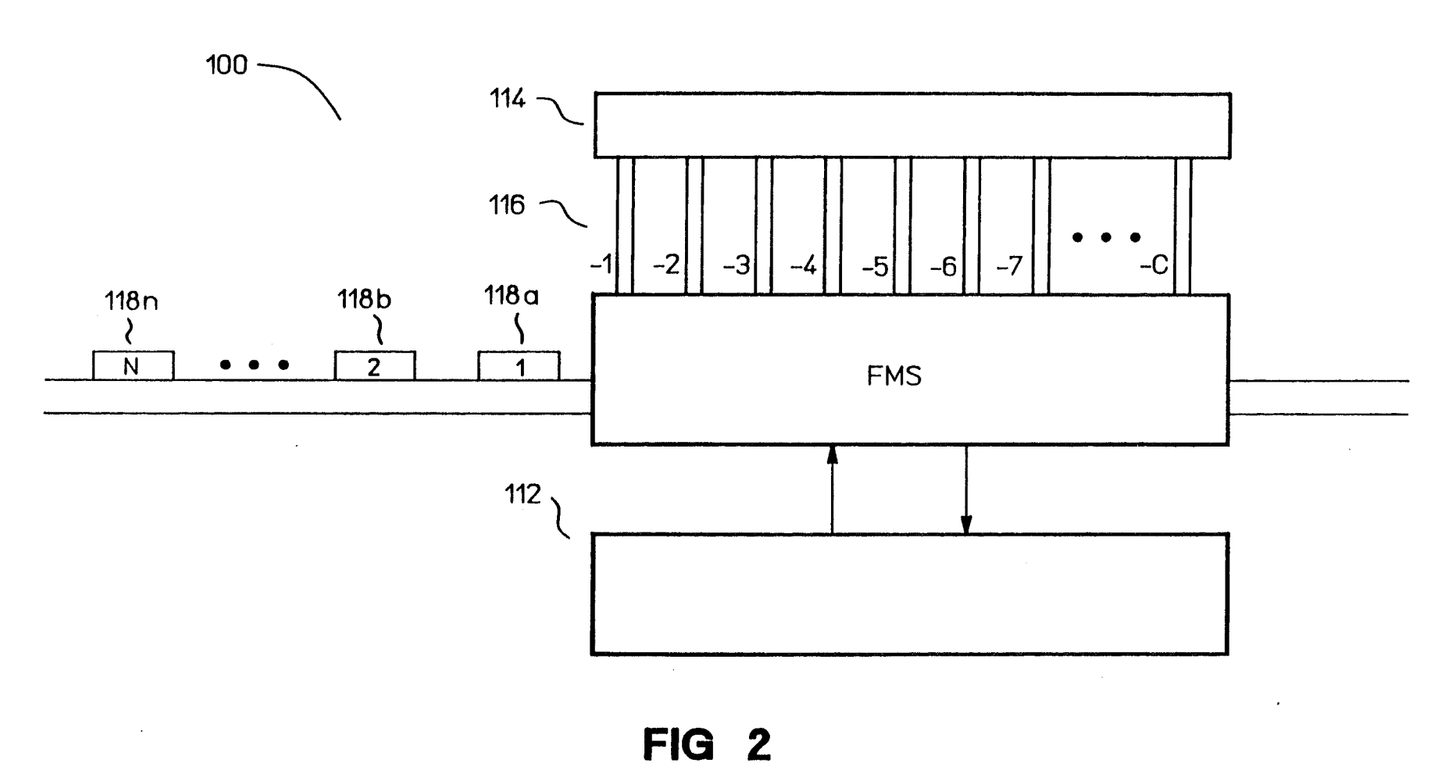
FIG. 2 is a block diagram illustrating a flexible manufacturing system in which the method of FIG. 1 can be practiced.

Method 10 is employed by a flexible manufacturing system 100 comprising an FMS machine 110 connected electrically to a computational means (or controller) 112, as shown in FIG. 2. FMS machine 110 receives a particular complement or configuration of components from a component inventory 114 via component feeders 116 (feeders 116-1 through 116-C). A sequence of jobs (first job 118a, second job 118b to an Nth job 118n) travel through FMS machine 110 in order to receive the appropriate number and type of components. The sample sequencing problem for this flexible manufacturing system has eight jobs scheduled for production, A through H. System 100 has a component inventory of 14 component types and a total of six feeder locations 116 for these components. Each job requires no more components than exist feeders (i.e. no more than six). Table I presents the assignment of components to jobs. In the table, Job X represents the initial state of the machine at the beginning of the production day. In the initial state, the feeders are occupied by component numbers 3, 5, 7, 9, 10 and 12.

TABLE I

| | Assignment of Components to Jobs | | | | | | | |
|---|---|---|---|---|---|---|---|---|
| | X | A | B | C | D | E | F | G | H |
| [1] | | 1 | | | | | | | |
| [2] | | 1 | | 1 | 1 | | | | 1 |
| [3] | 1 | | 1 | 1 | | 1 | | 1 | |
| [4] | | | | | 1 | | | 1 | |
| [5] | 1 | 1 | 1 | | | 1 | ·1 | | |
| [6] | | | | | | | 1 | 1 | |
| [7] | 1 | | | | | 1 | | 1 | |
| [8] | | | | | 1 | | | 1 | |
| [9] | 1 | 1 | | 1 | | | | 1 | 1 |
| [10] | 1 | | | 1 | | | | 1 | |
| [11] | | | | | | | | 1 | |
| [12] | 1 | 1 | 1 | | | | | | |
| [13] | | | | | | | | | 1 |
| [14] | | 1 | | | | | | | |

Figure 3:
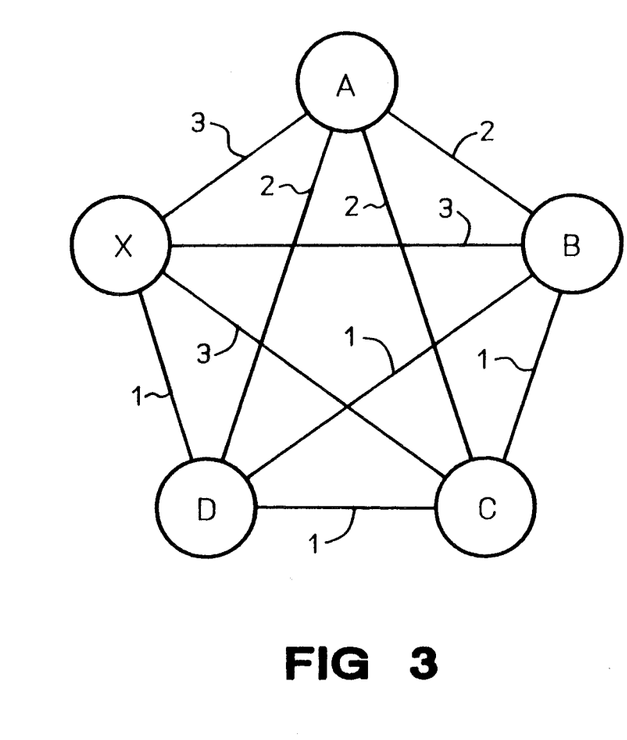
FIG. 3 is a schematic diagram illustrating inter-job distance assignments in accordance with the method of FIG. 1.

The first step 11 of the set-up optimization algorithm assigns distances between each job pair, to provide the data for solving the associated static traveling salesman problem. In the preferred embodiment, these distances or pair values are assigned based upon the commonality between the pair: e.g. job pair AB share two components in common, 5 and 12, giving AB a distance of 2. The attribution of pair values is applied to all possible selections of job pairs. The resulting distance map is revealed in FIG. 3, where, for convenience, only half of the jobs are shown. Due to the simplicity of the example, the commonalities between jobs are all rather small. However, unlike previous algorithms, increasing the numbers of components used helps the problem by both increasing and spreading out the distances between job pairs. Instead of distances ranging from 0 to 3, distances in a realistically complex sequencing problem might range from 0 to 50, allowing for a much better initial solution to the static traveling salesman problem.

The second algorithm step 12 solves the static TSP approximation of the job sequence problem. The preferred embodiment may employ a variety of techniques exist for solving static TSPs. The static TSP may be solved optimally, but with perhaps greater expenditure of computational resources, using a branch and bound algorithm. Instead, one may employ a farthest insertion algorithm followed by a 3-optimal algorithm to generate a good (but perhaps not optimal) solution to the static traveling salesman problem in a minimal amount of time. The farthest insertion algorithm may be found in Golden, B., Bodin, L., Doyle, T. and Stewart, W., "Approximate Traveling Salesman Algorithms", *Operations Research*, Vol. 28, 1980, pp. 694–711. The 3-Optimal Algorithm is described in Lin, S. and Kernighan, B. W., "An Effective Heuristic Algorithm for the Traveling Salesman Problem", *Operations Research*, Vol. 21, 1973, pp. 498–516. Despite probable non-optimality, one may choose to keep the resultant solution to the *static* TSP. The preferred embodiment improves upon the initial solution. The remainder of the invention uses the job sequence $J_0$ resulting from the second step to provide a seed sequence for tackling the more difficult *dynamic* problem of the actual job sequence. For the jobs as shown in Table I, solving the static traveling salesman problem might yield the following static solution for $J_0$:

XCGFADHEB

The sequence $J_0$, along with appropriate component requirements for each job are given in Table II.

TABLE II

| | \multicolumn{9}{c}{Job Sequence $J_0$} |
|---|---|---|---|---|---|---|---|---|
| | X | C | G | F | A | D | H | E | B |
| [1] | | | | 1 | | | | | |
| [2] | | 1 | | | 1 | 1 | 1 | | |
| [3] | 1 | 1 | | | | | | 1 | 1 |
| [4] | | | 1 | | 1 | | | | |
| [5] | 1 | | | 1 | 1 | 1 | | | 1 |
| [6] | | | 1 | | | | 1 | | |
| [7] | 1 | 1 | | | | | | 1 | |
| [8] | | | 1 | | | 1 | | | |
| [9] | 1 | 1 | | 1 | 1 | 1 | | | |
| [10] | 1 | 1 | 1 | | | | | | |
| [11] | | | 1 | | | | | | |
| [12] | 1 | | | | 1 | | | | 1 |
| [13] | | | | | | | 1 | | |
| [14] | | | | | 1 | | | | |

The third step 13 generates the optimal (i.e. minimal) number of component switches for the initial solution sequence $J_0$ using the KPNS approach, which has the following rules:

1. At any instant, no part (component or tool) is inserted unless it is required by the next job.
2. If a part must be inserted, the parts that are kept (not removed) are those needed the soonest in successive jobs.

The KPNS policy is optimal for any component or tool replacement problem for a given job sequence. At a point in time between two job states of the manufacturing system, the current configuration of components are divided into two sets: those components R required for the next job and those components S available for swapping. The number NP of other components not present but needed to manufacture the next job run determines the actual number of components to be swapped. Each swappable component $S_i$ is ranked by the length in sequence time till it is needed next. Ties are broken arbitrarily. Then components $S_i$ are swapped out in order of longest sequence length, until NP components have been swapped in. Followed consistently, the KPNS policy results in a minimal number of component swaps for any given job sequence.

Using the initial job sequence $J_0$ (Table II) found for the example problem, job C shares three components 3, 9 and 10 with the initial state X of the machine, leaving a set S of 3 components (5, 7 and 12) to be swapped out. However, job C requires only one more component, number 2, to complete its task, so only one out of set S needs to be swapped. The first time component 5 is needed in sequence $J_0$ is in job F, 2 jobs away. Component 7 is required at job G, 1 job away. And component 12 is required next at job A, three jobs away. Proceeding in descending order of time until required, component 12 is the candidate to be replaced by component 2, since component 12 is needed later than the other swappable components S. The same process repeats at each job set-up point, until the entire sequence of components swaps is determined.

An alternative method for employing a KPNS algorithm may also be used. Instead of calculating the lengths in sequence time a given component $S_i$ is required, one proceeds job-by-job, taking away components from the swappable set until the proper number of components for swapping remain. Using the same example, the set S of swappable components contains 3 components 5, 7 and 12, but is necessary to swap only one component. Component 7 is required by job G, so it is removed from set S. The next job F requires component 5. The search stops since only component 12 remains in set S and only one component must be switched. This method has the advantage, especially with larger numbers of components to switch, of reducing computational time. Since all other components were needed sooner, the remaining components S must be switched. Thus, one does not have to compute their sequence lengths. Despite any differences in computational procedure, either of the foregoing methods of employing a KPNS strategy arrives at the same component switches for job sequence $J_0$.

The job sequence $J_0$ provides a seed or first solution sequence for the iterative perturbation steps of 14 through 18, while the number of component swaps, the swapping value, determined in step 13 provides an initial benchmark for comparing any improvement results from sequence perturbations. In the fourth step 14, a single pair of jobs in sequence $J_0$ are switched. As shown, $J_0$ becomes $J_0^1$:

$J_0$:XCGFADHEB $J_0^1$:XGCFADHEB

For a given initial job sequence having N jobs, there are a total of $N(N-1)/2$ possible pair-wise switches or *perturbations*, all of which should be tried as improvements on the current sequence. The complete set of perturbated sequences derived from a given nth solution sequence will be termed an "nth solution set" of sequences.

For each pair-wise exchange or perturbation resulting from step 14, step 15 recalculates the optimal number of component swaps, applying the same KPNS procedure as outlined in step 13. The number of switches along with its corresponding perturbed sequence can be temporarily stored in memory for easy comparison with all other sequences of the solution set. The iterative loop of step 16 returns the process to step 14, allowing the current sequence to have all possible pairs of jobs exchanged and their respective component switches counted and tabulated in step 15. Once all possible exchange perturbations are accomplished, algorithm control passes to step 17.

Step 17 compares the complete set of tabulated component switches to the initial swapping value for the unperturbed initial sequence. If any improvement has occurred, i.e. one or more of the perturbed sequences use less component switches than the initial sequence, then two steps are taken. First, the variant sequence $J_0^i$ with the lowest number of component switches becomes the new current sequence $J_1$. Second, the number of component switches for the new current sequence $J_1$ becomes the new swapping value for comparison. Iterative step 18 then passes control to the step 14, 15 and 16 control structure to completely tabulate new numbers of component switches for pair-wise perturbations of the new current sequence $J_1$.

If step 17 finds no improvement in any of the perturbed sequences $J_0^i$ over the initial benchmark swapping value of sequence $J_0$, then the perturbation portion of the algorithm terminates. The last current sequence, in this case $J_0$, remains as the job sequence solution to the dynamic traveling salesman problem. While this sequence may not be strictly optimal, the outlined algorithm simply and effectively finds a very good solution to the problem. The described algorithm of the preferred embodiment demonstrates its ability for discovering near-optimal solutions to difficult job sequencing problems using a minimum of computational resources.

An absolute lower bound on numbers of component changes may be calculated for a given sequencing problem to compare in a simple and useful way how close the solution obtained using the methods of the present invention are to an optimal sequence solution. To calculate the absolute lower bound, one counts the total number of unique component types required for all the jobs (providing a "unique set") and substracts from this number the number of components from the unique set already in place in the start-up configuration. The lower bound represents an absolute minimum for the number of component swaps required for a given sequence, often a smaller number than that found for the actual optimal solution. However, one knows that the number of switches required by the sequence obtained by the algorithms of the present invention must be less than or equal to the switches required by an optimal solution, which in turn must be less than or equal to that required by the lower bound value. Hence, if the obtained solution requires the same number as the lower bound solution, it must then also be the optimal solution sequence for the problem. In other cases, one at least has a rough estimate of how far from optimal the solution is.

Based on limited experiments using approximately 100 different data sets, for all problems consisting of less than 10 jobs in a job sequence, optimality was verified about 75% of the time. That is, the number of component swaps for the final sequence was identical to the problem's lower bound. For the remaining 25% of the experiments, and for larger problems, the lower bound was never more than 10 to 15% superior in numbers of component switches than the solution found by the algorithm. Since the lower bound is always better than or equal to the actual optimal solution, the algorithm provides optimal or near-optimal solutions requiring no more than 10 to 15% more component switches than the actual optimal solution to the sequencing problem.

After step 17 has settled upon a final near-optimal sequence for the set of jobs, step 18 applies a modified KPNS policy. The modified KPNS policy has the following properties:

1. At any instant, no component is inserted unless it is required by the next job.
2. If a component must be inserted, the components that are kept (not removed) are those needed the soonest in successive jobs.
3. If a subset of components are not needed later in the sequence at all, selections are made from unneeded components on the basis of least historical use.

In other words, it may be that a certain number of current components are not needed by the remainder of the job sequence. Instead of assigning these components the same "sequence length" for next use (i.e. if N is the length to the last job, assign them all N+1), the modified KPNS policy assigns the components different "use lengths" based upon their statistical probability of use. Components with a historically high frequency of use receive relatively short use lengths. First, the set of swappable components is divided into two subsets, those components needed later in the job sequence, $S_N{}^j$, and those unneeded by the remainder of jobs, $S_U{}^j$. Components are swapped first from the unneeded component set $S_U{}^j$ on the basis of their use lengths. Only if the subset $S_U{}^j$ becomes exhausted are components removed from the needed component subset $S_N{}^j$ on the basis of the sequence lengths (as in normal KPNS).

While the modification to the standard KPNS policy makes no improvement in component swaps to the current job sequence, it provides a high probability of long-term improvements to future optimization operations with new job sequences. By leaving the machine configured today with components most likely to be used, tomorrow's job sequence will receive an initial state X of components very likely to help rather than hurt its sequencing.

The final result of the algorithm is a sequence of jobs for the current run and a list of components to be swapped between each job. While the foregoing example is illustrative of certain of its facets, the present invention is most advantageously used with much larger problems, involving FMS machines capable of holding a hundred or more components, selected from very large inventories. A commonality-based distance is assigned to each job pair and the static formulation of the traveling salesman problem yields a good initial job sequence for use in the iterative perturbation algorithm. A modified KPNS policy calculates the final component swappings for the resultant job sequence, yielding a near-optimal solution which accounts both for current and future job sequence needs. The resulting job sequence and lists of component swaps may be sent to a computer-controlled manufacturing system, as described in the pending patent application "A Manufacturing Interface System", Ser. No. 07/164276, filed Mar. 4, 1988, where a recipe generator converts the job sequence and component swaps into machine instruction programs for automatically starting and stopping manufacturing jobs and for automatically removing and installing required components. The complete system, from proper sequence determination to actual manufacturing, can therefore operate completely under computer control, essentially free from human intervention.

FORMALIZATION: GENERAL FMS SCHEDULING PROBLEM

A preferred formalization of a flexible manufacturing system job scheduling program defines an optimal job sequence as one that minimizes total set-up time, when that time may be defined as a multiple of separate reconfiguration steps (swapping either components or tools from the FMS resource). In other words, the objective is to minimize F, where:

$$MinF = Min \sum_{i=1}^{M} \sum_{n=1}^{N} y_{in}(1 - y_{i,n-1}) \tag{1}$$

Subject to:

$$\sum_{n=1}^{N} x_{jn} = 1 \quad j = 1, \ldots, N \tag{2}$$

$$\sum_{j=1}^{N} x_{jn} = 1 \quad n = 1, \ldots, N \tag{3}$$

$$\sum_{i=1}^{M} y_{in} \leq C \quad n = 1, \ldots, N \tag{4}$$

$$r_{ij}x_{jn} \leq y_{in} \quad \text{for all } i, j, n \tag{5}$$

$$x_{jn}, y_{in} = 0,1 \quad \text{for all } i, j, n \tag{6}$$

Expression 1 describes the total number of part switches for the series of jobs to be sequenced. In the following formalization, "parts" embrace both components and/or tools. The symbols of expression 1 are used as follows:

N is the total number of Products to be processed (the number of jobs).

M is the total number of part types (components or tools).

i is the part type index.

n is the position index for each of N product jobs in the job sequence.

$y_{in}$ is an assignment-dependent variable which equals 1 if part i is on the FMS machine at sequence position n, and equals 0 if not. The expression $y_{in}(1-y_{i,n-1})$ is 1 if part i is not in position at time $n-1$ but is on the machine at time n. Otherwise the expression is 0.

Thus, expression 1 counts how many switches occur for all parts 1 to M and for all product/jobs 1 to N.

Expression 2 requires that all product/job runs must be assigned one and only one position in the job sequence. Further variables included in expression 2 are defined as follows:

j is the index for each product run, having the values of 1 to N.

$x_{jn}$ is an assignment-dependent variable which equals 1 if a particular product/job j is assigned to sequence position n and is 0 otherwise.

Expression 3 requires that each position in the sequence must have exactly one product/job. Expression 3 differs from expression 2 in that its index is over n, the sequence position index, rather than over j, the product type index. Taken together, expressions 2 and 3 ensure that a total of N products are placed one-to-one in a sequence of N sequence positions.

Expression 4 ensures that at any sequence point n, there are no more parts on the machine than it's capacity C, where:

C is the part capacity of the FMS machine ($C \leq M$).

Expression 5 requires that all the required parts for a given product are assigned and waiting on the FMS machine at the appropriate time n. The parameter $r_{ij}$ is defined as follows:

$r_{ij}$ is a product-dependent parameter which equals 1 if part i is required for product j, and is 0 otherwise.

Expression 6 formalizes the definitions given above: that both the product assignment variable $x_{jn}$ and the part assignment variable $y_{in}$ take on only integer values of 0 and 1, depending on whether a product j or a part i have been assigned to sequence position n.

The principle steps of the present invention may be recast using the described mathematical formalism:

First Step 11. Assign an index of commonality between each pair of products j, k such that the commonality index, or "pair value", represents a monotonic function of the number of common parts shared by the two products. A function f(x) is monotonic if for all numbers a and b, either $a<b \rightarrow f(a) \leq f(b)$ (a positive monotonic function) or $<b \rightarrow f(a) \geq f(b)$ (a negative monotonic function).

Second Step 12. Using the pair values found in the first step as "distances", solve a simplified static traveling salesman problem by maximizing the total commonality among the product sequence: maximize the part-keeping distance, or "sequence value".

Third Step 13. For the first solution sequence of product assignments $x_{jn}^0$ found in the second step calculate an optimal assignment of parts $y_{in}$ at each sequence point n, using a keep-part-needed-soonest KPNS policy. The KPNS policy may be formalized as follows:

a. Let J be the vector whose ith entry $J_i$ equals 1 (or 0) if part i is (is not) on the machine at a given instant n. Let the integer L(i,n) be the first instant at or after instant n at which part i is needed. L(i,n) = N if part i is not needed after the last job position n.

b. Set $J_i = 1$ for C values of i representing those parts initially present on the machine before any job is scheduled. Set $J_i = 0$ for the remaining $M - C$ values of i. Set n = 0.

c. Set $y_{in} = J_i$. Stop if n = N, else set n = n + 1.

d. If each i having L(i,n) = n also has $J_i = 1$, go to step c.

e. Pick an i having L(i,n) = n and $J_i = 0$. Set $J_i = 1$.

f. Set $J_k = 0$ for a k that maximizes L(p,n) over {p: $J_p = 1$}. Go to step d.

Steps c and d ensure that $y_{in}$ consists of all the parts required by the nth job in the sequence. Steps b and e require that parts be inserted before a job (property 1 of the KPNS policy). Parts to be kept because they are needed soonest (property 2 of the KPNS policy) are determined by the parts which are removed from the machine, determined in step f. The resulting assignments of parts $y_{in}$ represent successive configurations of the FMS machine for processing the job sequence $x_{jn}^0$. Calculating the summations of equation (1) provides a "swapping value" for the job sequence: the minimal number of part swappings the sequence requires.

Fourth Step 14. Switch a single pair of jobs $x_{jn}$, $x_{k0}$ at sequence positions n and 0 in the initial job sequence, such that $x_{jn}$ becomes $x_{j0}$ and $x_{k0}$ becomes $x_{kn}$.

Fifth Step 15. Reapply the KPNS policy of the third step (13) to the perturbed sequence resulting from the pair-wise switching of the fourth step (14). Determine the swapping value for this new perturbed job sequence, again using the summations of equation (1).

Sixth Step (16). Repeat steps four and five (14 and 15) until all possible pairs of the current sequence have been switched and the swapping values have been calculated for each perturbed sequence. The complete collection of the current solution sequence $x_{jn}^0$ and all derivative perturbed sequences forms a "solution set". If there are N number of jobs in the sequence, there will be a total number of $N(N-1)/2$ sequences in the solution set.

Seventh Step (17). For the solution set comprising the first solution sequence of jobs $x_{jn}^0$ and all perturbed variant sequences determine the sequences having the smallest swapping value. If that sequence remains the first solution sequence, the perturbation procedures of the fourth, fifth and sixth steps have ended. If the minimal sequence is different, it becomes the new solution sequence $x_{jn}^1$ and the perturbation algorithms begin again, by repeating step four.

Eighth Step (19). As soon as no perturbations have improved upon a current solution sequence x, it remains as the end solution to the FMS sequencing problem. A modified KPNS algorithm is then applied to the job sequence. The modified KPNS algorithm follows the algorithm given in step with one alteration: if a part i is not needed after instant n, assign a number to L(i,n) greater than N in inverse proportion to its probability of use. In other words, if two parts $i_0$ and $i_1$ are no longer needed for the remaining jobs and $i_0$ has a 50% chance of use and $i_1$ has a 25% chance of use, assign $L(i_1,n) > L$-

$(i_0, n) > N$. The remaining rules of the KPNS policy will then insure that part $i_1$ is removed first.

The set-up optimization procedure of the present invention, while not guaranteeing an optimal solution for an FMS sequencing problem, typically arrives at a job sequence with a close-to-optimal number of part switches in a reasonable length of computation time. In addition, to assure near-optimality for the final sequence, a lower bound calculation provides a limit on how few part changes are possible for the current collection of jobs. The general methods described may be profitably applied to any sequencing problem where set-up times vary with exact job sequence. Although the invention has been described in detail with reference to a particular preferred embodiment, those skilled in the art should recognize that various modifications and enhancements may be made without departing from the spirit and scope of the claims that follow.

What is claimed is:

1. A method of controlling the operation of a machine that is capable of performing a plurality of jobs, each job requiring a plurality of parts, the method comprising:

arranging a plurality of jobs in a first sequence;

calculating a first sequence value by assigning a pair value to each pair of jobs in the first sequence, the pair value being a monotonic function of how many parts are common to both jobs of the pair, and summing the pair values of all the pairs of jobs in the first sequence;

if the monotonic function is positive, finding a maximal job sequence by repeating the arranging and calculating steps for each of a plurality of different possible job sequences and selecting that sequence which has the largest sequence value;

if the monotonic function is negative, finding a maximal job sequence by repeating the arranging and calculating steps for each of a plurality of different possible job sequences and selecting that sequence which has the smallest sequence value;

providing the parts required by the various jobs to the machine in the order of the maximal job sequence; and causing the machine to perform the jobs with the provided parts in the order of the maximal job sequence.

2. A method as in claim 1 wherein the arranging and calculating steps comprise:

assigning a pair value to each possible pair of jobs;
arranging the jobs in the sequence; and
summing the pair values of all the pairs in the sequence to obtain the sequence value.

3. A method as in claim 1 wherein the monotonic function comprises setting the pair value equal to the number of parts common to both jobs of the pair.

4. A method as in claim 1 wherein arranging the jobs in a sequence comprises determining a sequence by evaluating a traveling salesman algorithm.

5. A method as in claim 1 wherein the monotonic function is positive and finding a maximal job sequence comprises determining an optimal configuration state for each job in the maximal job sequence.

6. A method as in claim 5 wherein determining the optimal configuration state comprises using a keep-part-needed-soonest algorithm.

7. A method as in claim 5 and further comprising:

generating a first solution set of job sequences by deriving a plurality of variant sequences from the maximal job sequence by a predetermined perturbation algorithm;

determining an optimal configuration state for each job in each variant sequence; defining a swapping value for each sequence in the first solution set by summing the part swaps for each successive pair of optimal configuration states of the sequence; and determining a second solution job sequence by selecting, from among the job sequences in the first set, that sequence having the lowest swapping value.

8. A method as in claim 7 and further comprising:

comparing an n-th solution sequence with an $(n-1)$-th solution sequence;

if the sequences have the same swapping value, selecting the n-th solution sequence as an optimal solution sequence; and if the sequences do not have the same swapping value:

generating an n-th solution set of job sequences by deriving a plurality of variant sequences from the n-th solution sequence by a determined perturbation algorithm;

determining an optimal configuration state for each job in each variant sequence of the n-th solution set;

defining a swapping value for each sequence in the n-th solution set by summing the part swaps for each successive pair of optimal configuration states of the sequence; and determining an $(n+1)$-th solution job sequence by selecting, from among the job sequences in the n-th set, that sequence having the lowest swapping value.

9. A method as in claim 8 wherein the step of determining an optimal configuration state for each job in each variant sequence of the n-th solution set comprises using a keep-part-needed-soonest algorithm.

10. A method as in claim 9 and further comprising determining an optimal configuration state for each job of the optimal solution sequence by using a modified keep-part-needed-soonest algorithm, the modified algorithm comprising assigning priorities for removing from a current configuration state any parts not required for any pending job of the sequence.

* * * * *